(12) United States Patent
Zhu et al.

(10) Patent No.: US 12,255,591 B2
(45) Date of Patent: Mar. 18, 2025

(54) TEMPERATURE COMPENSATION BIAS CIRCUIT AND POWER AMPLIFIER

(71) Applicant: LANSUS TECHNOLOGIES INC., Guangdong (CN)

(72) Inventors: Wei Zhu, Guangdong (CN); Jiashuai Guo, Guangdong (CN)

(73) Assignee: LANSUS TECHNOLOGIES INC., Shenzhen (CN)

( * ) Notice: Subject to any disclaimer, the term of this patent is extended or adjusted under 35 U.S.C. 154(b) by 0 days.

(21) Appl. No.: 18/806,715

(22) Filed: Aug. 16, 2024

(65) Prior Publication Data

US 2024/0405734 A1    Dec. 5, 2024

Related U.S. Application Data

(63) Continuation of application No. PCT/CN2023/082968, filed on Mar. 22, 2023.

(30) Foreign Application Priority Data

Jun. 1, 2022    (CN) .......................... 202221383893.9

(51) Int. Cl.
H03F 3/24    (2006.01)

(52) U.S. Cl.
CPC ....... *H03F 3/245* (2013.01); *H03F 2200/447* (2013.01); *H03F 2200/451* (2013.01)

(58) Field of Classification Search
CPC .............. H03F 3/245; H03F 2200/447; H03F 2200/451
USPC ..................................... 330/296, 285, 207 P
See application file for complete search history.

(56) References Cited

U.S. PATENT DOCUMENTS

| | | | |
|---|---|---|---|
| 7,573,336 B2* | 8/2009 | Ishimaru | H03G 1/04 330/296 |
| 2006/0077001 A1 | 4/2006 | Jeon et al. | |

FOREIGN PATENT DOCUMENTS

| | | |
|---|---|---|
| CN | 113054915 A | 6/2021 |
| CN | 113271069 A | 8/2021 |
| CN | 216437157   | 5/2022 |
| CN | 217428086 U | 9/2022 |

OTHER PUBLICATIONS

International Search Report issued in corresponding International application No. PCT/CN2023/082968, mailed Jun. 16, 2023 (6 pages).

Written Opinion of the International Search Authority in corresponding International application No. PCT/CN2023/082968, mailed Jun. 16, 2023 (6 pages).

* cited by examiner

*Primary Examiner* — Andrea Lindgren Baltzell
*Assistant Examiner* — Khiem D Nguyen

(57) ABSTRACT

A temperature compensation bias circuit is provided, including a third resistor, a fourth resistor, a fifth resistor, a sixth resistor, a seventh resistor, a second capacitor, a third capacitor, a fifth capacitor, a fifth transistor, a sixth transistor, and a seventh transistor. A power amplifier is further provided, the power amplifier applies the temperate compensation bias circuit. Compared with the prior art, there are fewer effects on a bias point of the temperature compensation bias circuit when the temperature compensation bias circuit and the power amplifier are in RF operating states, the power amplifier is enabled to have good temperature compensation effect and high linearity.

7 Claims, 3 Drawing Sheets

TEMPERATURE COMPENSATION BIAS CIRCUIT AND POWER AMPLIFIER

TECHNICAL FIELD

The present disclosure relates to a technical field of amplifiers, and in particular to a temperature compensation bias circuit and a power amplifier.

BACKGROUND

In a current wireless transceiver system of a communication field, a radio-frequency (RF) power amplifier (PA) is one of key units in a wireless communication link. The RF PA is configured to amplify a modulated electrical signal carrying modulation information to a predetermined power level and excite an antenna at a rear end thereof to generate a corresponding electromagnetic wave signal to achieve wireless signal transmission.

Specifically, current PAs are processed using GaAs heterojunction bipolar transistor (HBT) technology, since a thermal conductivity is low and continuously decreases along with rise of temperature, a respectable power dissipation is generated and more heat is accumulated when the current PAs operates in a large signal state, that is to say, a self-heating effect. Since a base-emitter junction of a transistor is regarded as a PN junction, the rise of the temperature causes electrons in an emitter region of the transistor, and a total number of drifting electrons gradually increases along with the rise of the temperature. The temperature affects parameters of the transistor, changes of the parameters of the transistor causes that a static operating point of the transistor is changed along with changing of the temperature. Therefore, temperature drift of the transistor is always a key problem in a circuit design of the transistor.

temperature compensation bias circuits in the related art each includes a voltage detection circuit, an overvoltage protection module, and a controlled bias circuit module. As shown in FIG. 1, FIG. 1 is an application circuit diagram of a temperature compensation bias circuit in the related art. The temperature compensation bias circuit shown in FIG. 1 is a common temperature compensation bias circuit. Specifically, the temperature compensation bias circuit includes a first resistor R1, a second resistor R2, a first transistor T1, a second transistor T2, a third transistor T3, and a first capacitor C1. The temperature compensation bias circuit, a blocking resistor CIN, a choke inductor, and a power amplification transistor T4 together constitute an RF PA circuit. Specifically, a bias current of the power amplification transistor T4 is provided by a current mirror composed of the first transistor T1 and the third transistor T3, a quiescent current of the power amplification transistor T4 is amplified through adjusting the first resistor R1, the first transistor T1 and the second transistor T2 connecting corresponding bases with corresponding collectors to serve as diodes cooperates with the second resistor R2 to achieve temperature compensation.

However, in a practical application of the temperature compensation bias circuits in the related art, each of the temperature compensation bias circuit needs to concentrate positions of the first transistor T1, the second transistor T2, the third transistor T3, and the power amplification transistor T4 in a layout, so that when the first transistor T1, the second transistor T2, the third transistor T3, and the power amplification transistor T4 are in conditions with similar temperature environments, and the temperatures rise, a current $I_{be}$ of the power amplification transistor T4 and a current $I_{be}$ of the third transistor T3 also increase. Meanwhile, since the temperatures rises, in the current mirror, a conduction current of the first transistor T1 and a conduction current of the second transistor T2 increase, and according to an analysis of Ohm's law, voltage drop at two terminals of the first resistor R1 increases, a base voltage of the third transistor T3 decreases, thereby decreasing the current $I_{be}$ to suppress temperature drift. However, such solution has problems as follows. Aiming at achieving optimal temperature compensation, the first transistor T1, the second transistor T2, the third transistor T3, and the power amplification transistor T4 must operate in the same state with consistent temperature environments, various parameters of the first transistor T1, the second transistor T2, the third transistor T3, and the power amplification transistor T4 must be completely matched with each other, which obviously cannot be achieved in the practical application of the temperature compensation bias circuits, so that only the positions of the first transistor T1, the second transistor T2, the third transistor T3, and the power amplification transistor T4 are ensured to be concentrated in the layout to enable temperatures of various devices, particularly the first transistor T1, the second transistor T2, and the power amplification transistor T4, to be as consistent as possible to try the best to suppress the temperature drift. The second resistor R2 serves as a ballast resistor, adjusting the second resistor R2 may adjust the temperature compensation to a certain extent, however, the second resistor R2 may affect a bias point being in an RF operating state, specifically, change of gain curves of a PA and change of linearity performance of the PA are affected when a large RF signal is input, as shown in FIG. 2, a resistance value of RA>a resistance value of RB>a resistance value of RC>a resistance value of RD, therefore, the larger a resistance value of the second resistor R2, the smaller a gain. Therefore, an urgent technical problem to be solved by those who skilled in the art is to provide a bias circuit, in which a ballast resistor has fewer effects on a bias point of the bias circuit when the bias circuit is in an RF operating state, and the bias circuit is also capable of optimizing a temperature compensation effect of a PA of an RF amplification circuit and linearity of the PA of the RF amplification circuit.

Therefore, it is necessary to provide a novel temperature compensation bias circuit and a novel power amplifier to solve the above technical problem.

SUMMARY

In view of above deficiencies of the related art, the present disclosure provides a temperature compensation bias circuit and a power amplifier, which have fewer effects on a bias point of the temperature compensation bias circuit when the temperature compensation bias circuit is in a radio-frequency (RF) operating state, a temperature compensation effect of the power amplifier is good, and linearity of the power amplifier is high.

In order to solve above technical problems, in a first aspect, embodiments of the present disclosure provide the temperature compensation bias circuit for providing a bias current for a power amplifier. The temperature compensation bias circuit includes a third resistor, a fourth resistor, a fifth resistor, a sixth resistor, a seventh resistor, a second capacitor, a third capacitor, a fifth capacitor, a fifth transistor, a sixth transistor, and a seventh transistor. A first terminal of the third resistor is respectively connected to a first terminal of the fourth resistor and a voltage reference. A second terminal of the third resistor is respectively connected to a first terminal of the fifth capacitor and a base of the fifth transistor. A second terminal of the fifth capacitor is connected to ground. A second terminal of the fourth resistor is respectively connected to a collector of the fifth transistor, a first terminal of the third capacitor, a base of the seventh transistor, a first terminal of the second capacitor, and a collector of the sixth transistor. A second terminal of the third capacitor is connected to the ground. A second terminal of the second capacitor is connected to a first terminal of the fifth resistor. A second terminal of the fifth resistor is respectively connected to a base of the sixth transistor and a first terminal of the sixth resistor. An emitter of the sixth transistor is connected to the ground. An emitter of the fifth transistor is respectively connected to an emitter of the seventh transistor, a second terminal of the sixth resistor, and a first terminal of the seventh resistor. A collector of the seventh transistor is connected to a battery voltage. A second terminal of the seventh resistor serves as an output terminal of the temperature compensation bias circuit.

Furthermore, the seventh resistor is a parameter-adjustable resistor.

Furthermore, the second capacitor is a parameter-adjustable capacitor, the fifth resistor is a parameter-adjustable resistor.

Furthermore, the sixth resistor is a parameter-adjustable resistor.

In a second aspect, the present disclosure further provides the power amplifier, the power amplifier includes the temperature compensation bias circuit as foregoing.

Furthermore, the power amplifier further includes a fourth capacitor, a second inductor, and a radio-frequency (RF) amplification transistor. A first terminal of the fourth capacitor serves as an input terminal of the power amplifier. A second terminal of the fourth capacitor is respectively connected to an output terminal of a bias circuit module and a base of the RF amplification transistor. An emitter of the RF amplification transistor is connected to the ground. A collector of the RF amplification transistor serves as an output terminal of the power amplifier, and the collector of the RF amplification transistor is connected to a second terminal of the second inductor. A first terminal of the second inductor is connected to a supply voltage.

Furthermore, the second inductor is a choke coil or a chip inductor.

Compared with the related art, the temperature compensation bias circuit of the present disclosure includes the fifth transistor, the seventh transistor, and the fourth resistor, when a temperature rises, a current Ies of the fifth transistor also increases with rise of the temperature, since a relationship of $I_{E5}=I_{C5}+I_{B5}$ is satisfied, the $I_{B5}$ is much less than $I_{C5}$, the $I_{E5}$ is approximately equal to the $I_{C5}$, the $I_{C5}$ may increase along with the rise of the temperature. A voltage $V_{C5}$ of the collector of the fifth transistor satisfies a relationship of $V_{C5}=VCC-I_{C5}\times R4$, that is, when the $I_{C5}$ increases, the $V_{C5}$ decreases, so that a voltage of the base of the seventh transistor and $I_{E7}$ are decreased, thereby decreasing a current of $I_{B8}$, suppressing the $I_{B8}$ from increasing along with the rise of the temperature, a temperature compensation effect of the temperature compensation bias circuit is achieved. As an improvement, the temperature compensation bias circuit of the present disclosure further includes the seventh resistor, the temperature compensation effect of the temperature compensation bias circuit is further adjusted through the adjusting a value of the seventh resistor. In this way, there are fewer effects on the bias point of the temperature compensation bias circuit when the—compensation bias circuit and the power amplifier are in RF operating states, the power amplifier is enabled to have good temperature compensation effect and high linearity.

BRIEF DESCRIPTION OF DRAWINGS

The present disclosure is described in detail below with reference to drawings. Through detailed description made in conjunction with following drawings, the above or other aspects of the present disclosure shall become clearer and easier to understand. In the drawings.

DETAILED DESCRIPTION OF EMBODIMENTS

Specific embodiments of the present disclosure are described in detail below with reference to accompanying drawings.

Specific implementation modes/embodiments described herein are specific embodiments of the present disclosure, and are intended to illustrate a concept of the present disclosure, which are both explanatory and exemplary, and should not be construed as limiting implementation modes and a scope of the present disclosure. In addition to the embodiments described herein, those who skilled in the art shall also use other obvious technical solutions based on claims of the present disclosure and contents disclosed in the specification, and these technical solutions include technical solutions that make any obvious replacement and modification to the embodiments described herein, and are all within a protection scope of the present disclosure.

The present disclosure provides a temperature compensation bias circuit 100.

Figure 1:
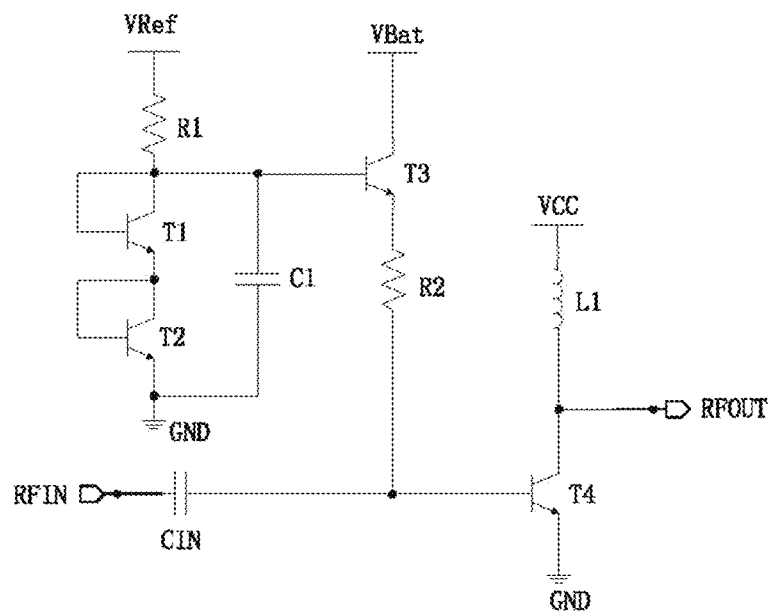
FIG. 1 is an application circuit diagram illustrating a temperature compensation bias circuit in the related art.
Figure 2:
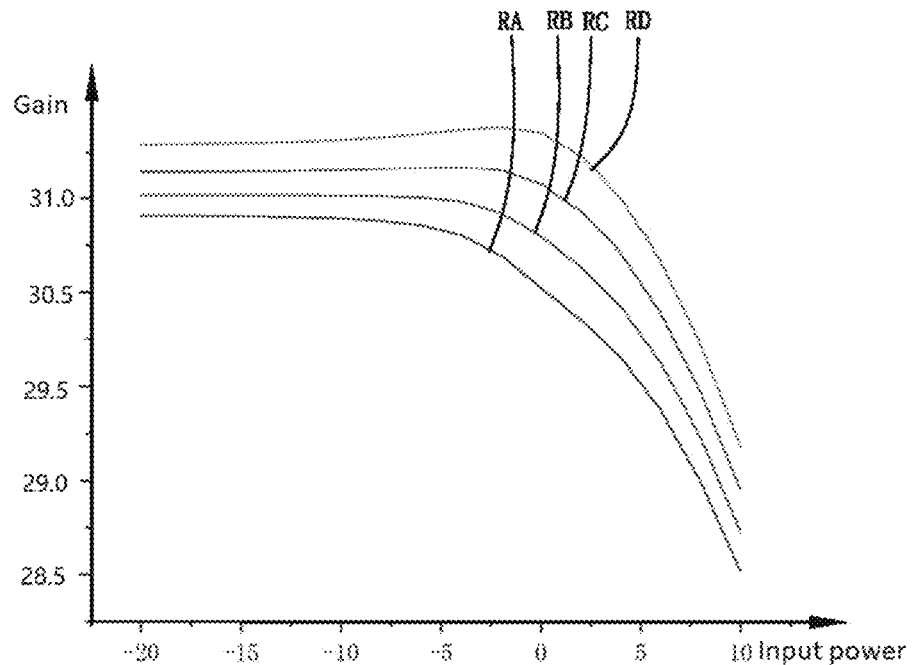
FIG. 2 is a schematic diagram illustrating a relationship of a gain and an input power of the temperature compensation bias circuit of FIG. 1.
Figure 3:
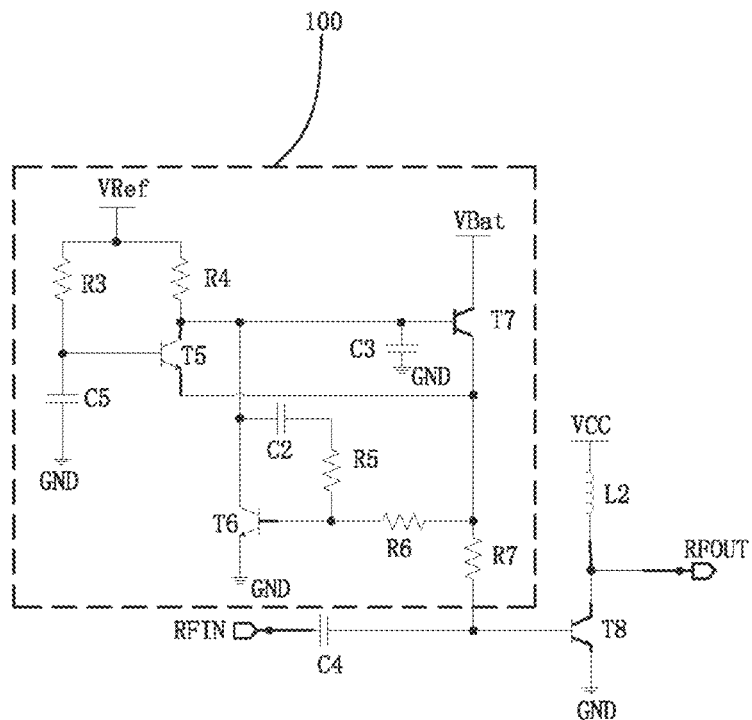
FIG. 3 is an application circuit diagram illustrating a temperature compensation bias circuit of the present disclosure.
Figure 4:
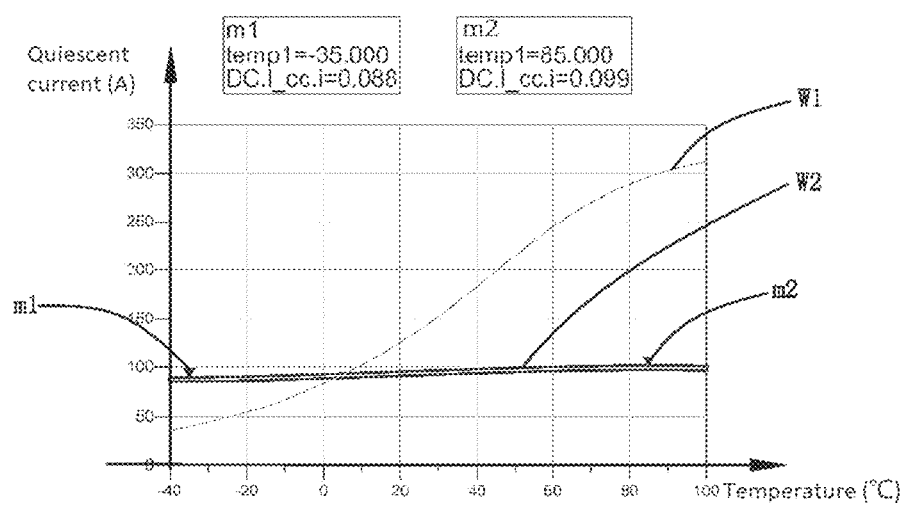
FIG. 4 is a schematic diagram illustrating comparison between relationship curves of quiescent currents and temperatures respectively in an application circuit of the temperature compensation bias circuit in the related art and an application circuit of the temperature compensation bias circuit of the present disclosure.
Figure 5:
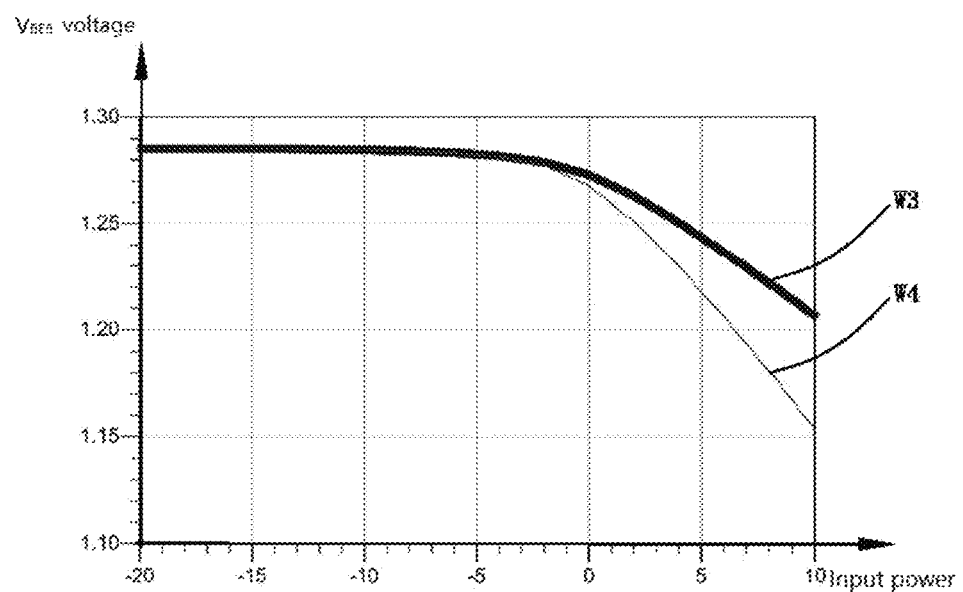
FIG. 5 is a schematic diagram illustrating relationship curves of $V_{BE8}$ voltages and input power of the temperature compensation bias circuit of the present disclosure.

Referring to FIGS. 3-5, FIG. 3 is an application circuit diagram illustrating the temperature compensation bias circuit 100 of the present disclosure. The present disclosure further provides a power amplifier using the temperature compensation bias circuit 100. Specifically, the power amplifier further includes the temperature compensation bias circuit 100, a fourth capacitor C4, a second inductor L2, and a radio-frequency (RF) amplification transistor T8.

Circuit connection relationships of the power amplifier are as follows.

A first terminal of the fourth capacitor C4 serves as an input terminal RFIN of the power amplifier.

A second terminal of the fourth capacitor C4 is respectively connected to an output terminal of a bias circuit module and a base of the RF amplification transistor T8.

An emitter of the RF amplification transistor T8 is connected to the ground GND.

A collector of the RF amplification transistor is connected to a second terminal of the second inductor, and the collector of the RF amplification transistor T8 serves as an output terminal RFOUT of the power amplifier.

A first terminal of the second inductor L2 is connected to a supply voltage VCC.

Specifically, the fourth capacitor C4 serves as a blocking capacitor, only an RF signal is capable of passing through the fourth capacitor C4, and a direct-current (DC) voltage is prevented from entering the RF amplification transistor T8.

The second inductor L2 is a choke coil or a chip inductor. The second inductor L2 is configured to prevent the RF signal from entering a power supply, and only a DC current is capable of passing through the second inductor L2. In the embodiment, the second inductor L2 is the choke coil.

The temperature compensation bias circuit 100 includes a third resistor R3, a fourth resistor R4, a fifth resistor R5, a sixth resistor R6, a seventh resistor R7, a second capacitor C2, a third capacitor C3, a fifth capacitor C5, a fifth transistor T5, a sixth transistor T6, and a seventh transistor T7.

Circuit connection relationships of the temperature compensation bias circuit 100 are as follows.

A first terminal of the third resistor R3 is respectively connected to a first terminal of the fourth resistor R4 and a voltage reference VRef.

A second terminal of the third resistor R3 is respectively connected to a first terminal of the fifth capacitor C5 and a base of the fifth transistor T5.

A second terminal of the fifth capacitor C5 is connected to ground GND.

A second terminal of the fourth resistor R4 is respectively connected to a collector of the fifth transistor T5, a first terminal of the third capacitor C3, a base of the seventh transistor T7, a first terminal of the second capacitor C2, and a collector of the sixth transistor T6.

A second terminal of the third capacitor C3 is connected to the ground GND. A second terminal of the second capacitor C2 is connected to a first terminal of the fifth resistor R5.

A second terminal of the fifth resistor R5 is respectively connected to a base of the sixth transistor T6 and a first terminal of the sixth resistor R6.

An emitter of the sixth transistor T6 is connected to the ground GND.

An emitter of the fifth transistor T5 is respectively connected to an emitter of the seventh transistor T7, a second terminal of the sixth resistor R6, and a first terminal of the seventh resistor R7.

A collector of the seventh transistor T7 is connected to a battery voltage VBat.

A second terminal of the seventh resistor R7 serves as an output terminal of the temperature compensation bias circuit 100.

An operating principle of the temperature compensation bias circuit 100 is as follows.

The temperature compensation bias circuit 100 is configured to provide a bias current for the power amplifier. Specifically, the fifth transistor T5 and the seventh transistor T7 are combined to provide a base bias current of the RF amplification transistor T8, and satisfy a relationship of $I_{B8}=I_{E5}+I_{E7}+I_{B6}$. The seventh resistor R7 serves as a ballast resistor. The third resistor R3 is a base current-limiting resistor of the fifth transistor T5 and is capable of adjusting a quiescent operating point of the fifth transistor T5. The fourth resistor R4 is a collector resistor of the fifth transistor T5, the fourth resistor R4 and the sixth transistor T6 jointly determine a quiescent operating point of the seventh transistor T7.

When temperatures of transistors being in quiescent operating points rise, a base current of the RF amplification transistor T8 increases, a current IEs of the fifth transistor T5 also increases with rise of the temperatures, since a relationship of $I_{E5}=I_{C5}+I_{B5}$ is satisfied, the $I_{B5}$ is much less than $I_{C5}$, the Ies is approximately equal to the $I_{C5}$, the $I_{C5}$ may increase along with the rise of the temperatures. A voltage $V_{C5}$ of the collector of the fifth transistor T5 satisfies a relationship of $V_{C5}=VCC-I_{C5}\times R4$, that is, when the $I_{C5}$ increases, the $V_{C5}$ decreases, so that a voltage of the base of the seventh transistor T7 and $I_{E7}$ are decreased, thereby decreasing a current of $I_{B8}$, suppressing the $I_{B8}$ from increasing along with the rise of the temperature, a temperature compensation effect of the temperature compensation bias circuit 100 is achieved.

In the embodiment, the seventh resistor R7 is a parameter-adjustable resistor. The temperature compensation effect of the temperature compensation bias circuit is further adjusted through the adjusting a value of the seventh resistor S7. Compared with a bias scheme in the prior art and the temperature compensation effect of the temperature compensation bias circuit of the present disclosure, please refer to FIG. 4, FIG. 4 is a schematic diagram illustrating comparison between relationship curves of quiescent currents and temperatures respectively in an application circuit of the temperature compensation bias circuit in the related art and an application circuit of the temperature compensation bias circuit 100 of the present disclosure. As shown in FIG. 4, W1 is a curve illustrating a relationship between a quiescent current and a temperature of the temperature compensation bias circuit in the prior art, and W2 is a curve illustrating a relationship between a quiescent current and a temperature of the temperature compensation bias circuit 100 of the present disclosure. According to the W2, when the temperature gradually changes from 35° C. to 85° C., the quiescent current output by the temperature compensation bias circuit 100 increases from 0.088 amps to 0.099 amps, the quiescent current is stable and has very small changes. Temperature drift of the RF amplification transistor T8 is significantly less than temperature drift of the temperature compensation bias circuit in the prior at the same normal-temperature quiescent operating current. Therefore, the temperature compensation bias circuit achieves bias circuit temperature compensation, meanwhile, an effect of the ballast resistor is independent of temperature compensation, and the ballast resistor is configured to adjust a gain curve of the power amplifier, so as to adjust a bias to optimize the temperature compensation effect of power amplifier and the linearity of the power amplifier. The seventh resistor R7 serves as the ballast resistor and is capable of adjusting a base current of the power amplifier under a high-power input, so as to adjust the gain curve of the power amplifier. The seventh resistor R7 is capable of adjusting a gain of the RF amplification transistor T8 without participating in the above temperature compensation, thereby almost not affecting temperature compensation performance of this solution. When power of an input signal is too high, swing exceeds a quiescent bias point, a conduction angle decreases, thereby resulting in decrease in a gain of the power amplifier under a large signal input and further causing gain compression.

The temperature compensation bias circuit 100 is connected to the ground GND through the fifth capacitor C5 and the third capacitor C3. The fifth capacitor C5 and the third capacitor C3 serve as linear capacitors and addition of the fifth capacitor C5 and the third capacitor C3 enables more RF components to leak to the bias, thereby increasing an emitter current of the fifth transistor T5 being in a stable radio frequency state and an emitter current of the seventh transistor T7 being in the stable radio frequency state, in this way, $I_{B5}=I_{E7}+I_{E5}+I_{B6}$ is increased, the quiescent bias point of the RF amplification transistor T8 under the large signal input is improved, and the gain compression is delayed. The fifth capacitor C5 and the third capacitor C3 serve as filter capacitors, and whether the temperature compensation bias circuit 100 includes the filter capacitors connecting to the ground directly affects BES of the RF amplification transistor T8. Please refer to FIG. 5, FIG. 5 is a schematic diagram illustrating relationship curves of $V_{BE8}$ voltages and input power of the temperature compensation bias circuit 100 of the present disclosure. Specifically, W3 is a curve illustrating a relationship between a $V_{BE8}$ voltage and input power of the temperature compensation bias circuit 100 of the present disclosure, and W4 is a curve illustrating a relationship between a $V_{BE8}$ voltage and input power of a circuit, removing the fifth capacitor C5 and the third capacitor C3, of the temperature compensation bias circuit 100 of the present disclosure. According to FIG. 5, the temperature compensation bias circuit 100 includes the filter capacitors connected to the ground, which directly affects the quiescent bias point of the RF amplification transistor T8 under a condition that the RF amplification transistor T8 increases the large signal input, thereby delaying the gain compression. Flatness of the gain curve at the moment that the gain curve increases along with the input power is further adjusted through adjusting a size ratio of the fifth capacitor C5 to the third capacitor C3, and a linearity level of the power amplifier is optimized.

In order to further reduce baseband impedance of the temperature compensation bias circuit 100 and improve a problem of linearity deterioration of an output signal of the power amplifier. The temperature compensation bias circuit 100 includes the sixth transistor T6 and the sixth resistor R6, the sixth resistor R6 is configured to isolate. In a case that there is no RF signal input to the power amplifier, a voltage difference between the supply voltage VCC passing through the fourth resistor R4 and the sixth transistor T6 is converted into a bias voltage of the seventh transistor T7, thereby generating a bias current $I_{B8}$, and the bias current $I_{B8}$ is output to an input terminal of the RF amplification transistor T8 through the seventh resistor R7. In addition, in a case that is are RF signals input into the power amplifier, the seventh resistor R7 blocks most of the RF signals, but there is still partial RF signals leaking from the temperature compensation bias circuit 100, specifically, an RF signal attenuated by the seventh resistor R7 is isolated from a base low-resistance point of the sixth transistor T6 through the sixth resistor R6, so that the RF signal attenuated by the seventh resistor R7 is transmitted to the seventh transistor 7, thereby passing the RF signal attenuated by the seventh resistor R7. If the RF signal is a large signal (that is, a signal with relatively large power), the emitter of the seventh transistor T7 has an RF swing, and the RF swing decreases a bias voltage of a base-emitter junction (BE junction) of the seventh transistor T7 through a detection effect of the BE junction, so that $I_{E7}$ output by the emitter of the seventh transistor T7 is increased, thereby compensating reduction of a base voltage of the RF amplification transistor T8 with increase of the power of the input signal, and suppressing AM-AM distortion of the power amplifier under the large signal.

In the embodiment, the second capacitor C2 is a parameter-adjustable capacitor, the fifth resistor R5 is a parameter-adjustable resistor.

The second capacitor C2 and the fifth resistor R5 form a phase margin network. If the RF signal is coupled to the base of the sixth transistor T6 through the second capacitor C2 and the fifth resistor R5, and the RF signal coupled to the sixth transistor T6 enables base potential of the sixth transistor T6 to decrease along with the increase of the RF signal through a detection effect of a BE junction of the sixth transistor T6, so that emitter potential of the seventh transistor T7 also decreases, resulting in obvious AM-AM distortion of the power amplifier under the large signal, and further causing linearity deterioration of the power amplifier. It can be seen therefrom that introductions of the second capacitor C2 and the fifth resistor R5 all being parameter-adjustable improves stability of the bias circuit.

In the embodiment, the sixth resistor R6 is a parameter-adjustable resistor. The sixth resistor R6 for isolation and the second capacitor C2 for isolation are switchable. That is, the sixth resistor R6 is a variable resistor, and the second capacitor C2 is a variable capacitor. Through changing values of the sixth resistor R6 and the second capacitor C2 and selecting different baseband impedance bandwidths and different noise suppression degrees of the temperature compensation bias circuit 100 according to different modulation bandwidth signals, thereby increasing applicability and flexibility of a circuit of the temperature compensation bias circuit 100.

It should be noted that related circuits, resistors, and transistors used in the present disclosure are all common circuits and components in the art, and corresponding specific indexes and parameters are adjusted according to actual applications, which are not described in detail herein.

Compared with the related art, the temperature compensation bias circuit of the present disclosure includes the fifth transistor, the seventh transistor, and the fourth resistor, when the temperature rises, the current Ies of the fifth transistor T5 also increases with the rise of the temperature, since the relationship of $I_{E5}=I_{C5}+I_{B5}$ is satisfied, the $I_{B5}$ is much less than $I_{C5}$, the Ies is approximately equal to the $I_{C5}$, the $I_{C5}$ may increase along with the rise of the temperature. The voltage $V_{C5}$ of the collector of the fifth transistor T5 satisfies the relationship of $V_{C5}=VCC-I_{C5}\times R4$, that is, when the $I_{C5}$ increases, the $V_{C5}$ decreases, so that the voltage of the base of the seventh transistor T7 and the $I_{E7}$ are decreased, thereby decreasing the current of $I_{B8}$, suppressing the $I_{B5}$ from increasing along with the rise of the temperature, the temperature compensation effect of the temperature compensation bias circuit is achieved. As an improvement, the temperature compensation bias circuit of the present disclosure further includes the seventh resistor R7, the temperature compensation effect of the temperature compensation bias circuit is further adjusted through the adjusting the value of the seventh resistor S7. In this way, there are fewer effects on the bias point of the temperature compensation bias circuit when the—compensation bias circuit and the power amplifier are in RF operating states, the power amplifier is enabled to have good temperature compensation effect and high linearity.

It should be noted that the embodiments described above with reference to the accompanying drawings are only used to illustrate a scope of the present disclosure and not to limit the scope of the present disclosure, and those who skilled in the art should understand that modifications or equivalent replacements made to the present disclosure without departing from a spirit and the scope of the present disclosure shall fall within the scope of the present disclosure. Furthermore, unless otherwise noted in the context, words appearing in the singular include plural forms and vice versa. Additionally, all or a portion of any embodiment may be used in connection with all or a portion of any other embodiment unless specifically stated.

What is claimed is:

1. A temperature compensation bias circuit, for providing a bias current for a power amplifier, comprising:
   a third resistor;
   a fourth resistor;
   a fifth resistor;
   a sixth resistor;
   a seventh resistor;
   a second capacitor;
   a third capacitor;
   a fifth capacitor;
   a fifth transistor;
   a sixth transistor; and
   a seventh transistor;
   wherein a first terminal of the third resistor is respectively connected to a first terminal of the fourth resistor and a voltage reference;
   wherein a second terminal of the third resistor is respectively connected to a first terminal of the fifth capacitor and a base of the fifth transistor;
   wherein a second terminal of the fifth capacitor is connected to ground;
   wherein a second terminal of the fourth resistor is respectively connected to a collector of the fifth transistor, a first terminal of the third capacitor, a base of the seventh transistor, a first terminal of the second capacitor, and a collector of the sixth transistor;
   wherein a second terminal of the third capacitor is connected to the ground;
   wherein a second terminal of the second capacitor is connected to a first terminal of the fifth resistor;
   wherein a second terminal of the fifth resistor is respectively connected to a base of the sixth transistor and a first terminal of the sixth resistor;
   wherein an emitter of the sixth transistor is connected to the ground;
   wherein an emitter of the fifth transistor is respectively connected to an emitter of the seventh transistor, a second terminal of the sixth resistor, and a first terminal of the seventh resistor;
   wherein a collector of the seventh transistor is connected to a battery voltage; and
   wherein a second terminal of the seventh resistor serves as an output terminal of the temperature compensation bias circuit.

2. The temperature compensation bias circuit according to claim 1, wherein the seventh resistor is a parameter-adjustable resistor.

3. The temperature compensation bias circuit according to claim 1, wherein the second capacitor is a parameter-adjustable capacitor, the fifth resistor is a parameter-adjustable resistor.

4. The temperature compensation bias circuit according to claim 1, wherein the sixth resistor is a parameter-adjustable resistor.

5. A power amplifier, comprising:
   a temperature compensation bias circuit for providing a bias current;
   wherein a third resistor, a fourth resistor, a fifth resistor, a sixth resistor, a seventh resistor, a second capacitor, a third capacitor, a fifth capacitor, a fifth transistor, a sixth transistor, and a seventh transistor; a first terminal of the third resistor is respectively connected to a first terminal of the fourth resistor and a voltage reference, a second terminal of the third resistor is respectively connected to a first terminal of the fifth capacitor and a base of the fifth transistor, a second terminal of the fifth capacitor is connected to ground, a second terminal of the fourth resistor is respectively connected to a collector of the fifth transistor, a first terminal of the third capacitor, a base of the seventh transistor, a first terminal of the second capacitor, and a collector of the sixth transistor, a second terminal of the third capacitor is connected to the ground, a second terminal of the second capacitor is connected to a first terminal of the fifth resistor, a second terminal of the fifth resistor is respectively connected to a base of the sixth transistor and a first terminal of the sixth resistor, an emitter of the sixth transistor is connected to the ground, an emitter of the fifth transistor is respectively connected to an emitter of the seventh transistor, a second terminal of the sixth resistor, and a first terminal of the seventh resistor, a collector of the seventh transistor is connected to a battery voltage, and a second terminal of the seventh resistor serves as an output terminal of the temperature compensation bias circuit.

6. The power amplifier according to claim 5, wherein the power amplifier further comprises a fourth capacitor, a second inductor, and a radio-frequency (RF) amplification transistor;
   a first terminal of the fourth capacitor serves as an input terminal of the power amplifier;
   a second terminal of the fourth capacitor is respectively connected to an output terminal of a bias circuit module and a base of the RF amplification transistor;
   an emitter of the RF amplification transistor is connected to the ground;
   a collector of the RF amplification transistor serves as an output terminal of the power amplifier, and the collector of the RF amplification transistor is connected to a second terminal of the second inductor; and
   a first terminal of the second inductor is connected to a supply voltage.

7. The power amplifier according to claim 6, wherein the second inductor is a choke coil or a chip inductor.

* * * * *